(12) United States Patent
Neunaber

(10) Patent No.: US 8,204,240 B2
(45) Date of Patent: Jun. 19, 2012

(54) APPARATUS AND METHOD FOR ARTIFICIAL REVERBERATION

(76) Inventor: Brian C. Neunaber, Santa Ana, CA (US)

(*) Notice: Subject to any disclaimer, the term of this patent is extended or adjusted under 35 U.S.C. 154(b) by 1015 days.

(21) Appl. No.: 12/215,084

(22) Filed: Jun. 25, 2008

(65) Prior Publication Data

US 2009/0003614 A1 Jan. 1, 2009

Related U.S. Application Data

(60) Provisional application No. 60/937,817, filed on Jun. 30, 2007.

(51) Int. Cl.
*H03G 3/00* (2006.01)

(52) U.S. Cl. .......... 381/63

(58) Field of Classification Search .......... 381/63
See application file for complete search history.

(56) References Cited

U.S. PATENT DOCUMENTS

| | | | | |
|---|---|---|---|---|
| 4,215,242 A * | 7/1980 | Gross | | 381/63 |
| 4,489,439 A | 12/1984 | Scholz et al. | | |
| 5,491,754 A * | 2/1996 | Jot et al. | | 381/63 |
| 6,580,796 B1 | 6/2003 | Kuroki | | |

OTHER PUBLICATIONS

Authors: Stautner and Puckette, Title: Designing Multi-Channel Reverberators, Computer Music Journal, vol. 6 No. 1, pp. 52-65, Spring 1982.

Authors: Jot and Chaigne, Title: Digital Delay Networks for Designing Artificial Reverberators, Proc. 90th Conv. Audio Eng. Soc., preprint 3030, Feb. 1991.

Author:J. Frenette, Title: Reducing artificial Reverberation Requirements Using Time-Variant Feedback Delay Networks, Masters Thesis, University of Miami, Dec. 2000, http://mue.music.miami.edu/thesis/jasmin_frenette/ (Chapters 3.3, 3.4, 5).

Authors: Choi, et al., Title: Analysis and Design Algorithm of Time Varying Reverberator for Low Memory Applications, Proc. 119th Conv. Audio Eng. Soc., preprint 6561, Oct. 2005.

Author: S. Paranjpe, Title: Time-variant Orthogonal Matrix Feedback Delay Network Reverberator, Proc. 110th Conv. Audio Eng. Soc., preprint 5381, Oct. 2001.

* cited by examiner

*Primary Examiner* — Matthew Landau
*Assistant Examiner* — Khaja Ahmad
(74) *Attorney, Agent, or Firm* — Kevin L. Klug

(57) ABSTRACT

An apparatus and method for artificial reverberation having one or more input summing nodes receiving an input signal and which each feed a first series of delay elements and the output of which is thereafter summed, weighted, and fed back to the input summing nodes. Also, a feedback summing node which further feeds a second delay element which feeds an output with a signal which has multi-dimensional or multi-delay reverberation relative to the input signal. An alternative embodiment further feeds one or more of the first delay element outputs weighted via an output gain to an output summing node which also sums the output of the second delay element and provides a summed output having a multi-dimensional or multi-delay reverberation. The embodiment is easily and economically implemented via conventional integrated electronic circuits, a combination of analog and digital electronics, digital signal processors, microprocessors, micro-controllers, or computer algorithms.

19 Claims, 8 Drawing Sheets

APPARATUS AND METHOD FOR ARTIFICIAL REVERBERATION

This application claims priority of U.S. Provisional Patent Application No. 60/937,817, filed Jun. 30, 2007, entitled Apparatus and Method for Artificial Reverberation.

BACKGROUND OF THE INVENTION

The present invention relates to the processing of an audio signal for the simulation of acoustic reverberation in general and more particularly for application to musical instruments and vocals. The present art is especially adaptable to the electronic processing of audio signals in order to add user desired reverberation effect(s). Artificial reverberation simulates the ambience of a sound within an enclosed space, such as a large room or music hall.

Reverberation is commonly added to audio signals to increase the listener's perception of ambience and spaciousness. Natural reverberation occurs when a sound is radiated within an enclosed space; the sound reflects off of the various walls and objects within the room, traveling back to the listener later in time. This reflected sound, or reverberation, decays exponentially with time due to the sound's loss of energy as it is transmitted outward into a three-dimensional space. Typically, the sound decays more quickly at high frequencies due to the absorption of these frequencies by air and wall surfaces.

The sonic qualities of artificial reverberation are far easier to control than those of natural reverberation; and for this reason, artificial reverberation is commonly used in the creation, recording, and reproduction of sound. Artificial reverberation emulates natural reverberation by employing a combination of delays, frequency response filtering, and feedback. These mechanisms have been implemented by various means, including electromechanical, analog electronic, and digital electronic. Electromechanical means includes spring and plate reverberation. Analog electronic means includes the use of bucket-brigade delays (BBDs). Digital electronic means includes implementation with embedded digital hardware such as digital signal processors (DSPs), application-specific integrated circuits (ASICs), and software implementation within a general-purpose processing platform such as a personal computer.

Each of these various means of implementation have advantages and disadvantages relating to sound quality, cost, size, ease of manufacture, etc. Typically, cost is the primary consideration when selecting a reverberation device to be embedded within a consumer-grade audio product or entry-level professional product. Prior art spring reverberators (i.e. mechanical) are still commonly found in devices such as guitar amplifiers, because they are the lowest cost option. However, digital electronic reverberators are growing in popularity because of recent reductions in cost, size, and a generally superior sound quality. Creation or generation of high-quality, natural-sounding artificial reverberation almost exclusively employs digital circuitry, consisting of both memory for delay lines and computational logic for multiplication and summation. Many artificial reverberation processors are implemented using DSPs (digital signal processors) or similar microprocessors which are capable of high-speed arithmetic processing. The aforesaid DSPs are designed to perform a variety of processing algorithms and are not cost-optimized for simply generating reverberation. A cost-optimized digital solution requires an ASIC; however, this solution requires significant up-front engineering effort and cost. As such, the implementation of a simple reverb processor is more expensive than it needs to be.

Digital reverberator algorithms employ one or more delay lines which are typically configured as a combination of early reflections, comb filters, and all-pass filters. Early reflection filters are non-uniformly-decimated, non-recursive filters intended to simulate the initial 100 ms or so of the impulse response of reverberation. Comb filters in this context are recursive filters whose delayed outputs are fed back, weighted and summed with their inputs. The comb filter delays are typically between 50 ms and 100 ms in length and often embed a low-pass filter at their outputs to simulate the high-frequency absorption of sound in air. All-pass filters in this context are first-order filters with delay lengths anywhere between a few milliseconds to over 100 ms. The aforesaid filters are often combined in cascade and/or in parallel with feedback to create the reverberator algorithm. Often, multiple filter types are employed to overcome the inherent deficiencies of each and to provide adequate sound quality for a variety of input signals. Unfortunately, this results in the need for significant delay memory and computational resources, which further limits the cost reduction of digital reverberators.

Stautner and Puckette within the reference "*Designing Multi-Channel Reverberators*," (Computer Music Journal, vol. 6. no. 1, pp. 52-65, Spring 1982) introduced the feedback delay network (FDN), where the outputs of multiple delay lines are fed back through a feedback matrix before summation with the delay line inputs. In prior art parallel-comb filter reverberators, the output of each delay fed back only to its own input, described by the system equation:

$$y=z^{-\tau}(x+gy)$$

where x is the input, y is the output, $\tau$ is the delay in samples, g is the feedback coefficient, and $z=e^{j\omega}$ in Fourier space. FDN reverberators use a multiple of parallel delays whose outputs may feed back to multiple delay line inputs; however, certain conditions must be met to ensure stability of the network. That is the network cannot be allowed to satisfy the Barkhausen criteria of a unity loop gain and a multiple of $2\pi$ loop phase shift. Using matrices, the authors generalize the comb filter and thereby describe a plurality of parallel comb filters with the system equation $$Y=D(X+GY)$$

where X is a vector of N inputs, Y is a vector of N outputs, G is an N-by-N matrix of feedback coefficients, and D is a diagonal N-by-N matrix of delays in the form $$D=\begin{bmatrix} z^{-\tau_1} & & & 0 \\ & z^{-\tau_2} & & \\ & & \ddots & \\ 0 & & & z^{-\tau_N} \end{bmatrix}$$

Furthermore, the authors show that one way to ensure system stability is for $$G=AU$$

where the scalar $|A|<1$ and U is a unitary N-by-N matrix. In other words, U satisfies the condition $$\sum_{k=1}^{N} U_{ik} U_{jk} = \begin{cases} 1 & \text{if } i = j; \\ 0 & \text{otherwise} \end{cases}$$

For the reverberation to have more natural-sounding decay, low-pass filters are placed after each delay to simulate the high-frequency absorption of sound within ambient air. This is common in FDN reverberators and is further described herein.

Jot and Chaigne within the reference "*Digital Delay Networks for Designing Artificial Reverberators*," (Proc. 90th Conv. Audio Eng. Soc., preprint 3030, February 1991) expand on the work of Stautner and Puckette by presenting a more general z-domain transfer function for a single-input, single-output reverberator:

$$H(z)=c^T\cdot[D(z^{-1})-G]^{-1}\cdot b$$

where $D(z^{-1})$ and G are the delay and feedback matrices as defined by Stautner and Puckette, b is an N-length vector that weights the input signal before injection into the reverberator network, and c is an N-length vector that weights the reverberator outputs before mixing with the input signal. The signal flow diagram for the aforesaid transfer function is shown in FIG. 1.

In U.S. Pat. No. 5,491,754, entitled *Method and System for Artificial Spatialisation of Digital Audio Signals*, Jot et al. disclose a method and system for artificial spatialization of digital audio signals using an FDN. Jot discloses several embodiments which include parallel delay elements, each with local unit feedback and with global feedback of the summation of all delay outputs attenuated by −2/N, where N is the number of delay elements. This embodiment sums the input signal with all of the delay element inputs and sources output as the sum of all delay output. Furthermore, Jot discloses several embodiments that compute the unitary matrix U as $$U = J_N - \frac{2}{N} \cdot V_N^T \cdot V_N$$

where $J_N$ is an N-by-N permutation of the identity matrix and $V_N$ is an N-length row vector of all ones. One of Jot's embodiments simply uses an identity matrix in place of $J_N$, so that the feedback matrix becomes the following:

$$U = \begin{bmatrix} 1-\frac{2}{N} & & -\frac{2}{N} \\ & \ddots & \\ -\frac{2}{N} & & 1-\frac{2}{N} \end{bmatrix}$$

This simplification results in the signal flow diagram in FIG. 2. One can see from this simplification that the numbers of feedback paths are reduced from $N^2$ to N+1. Rather than every delayed output feeding back and summing with every delay input, each delay has local feedback weighted by A and summed with the sum of all delay outputs weighted by −2A/N. In Jot's embodiment, the value A is not shown but may be inferred to be included in the transfer function $H_i(z)$. Jot remarks that this embodiment results in a "spurious echo" at a period equal to the sum of delays $z^{-mi}$, which may be suppressed by selectively inverting the polarity of values within the input injection vector b or output mix vector c.

Distinctions can be made between Jot's embodiments and the present art. Jot's embodiments specify that the input signal is summed (with selective polarity inversions) into the inputs of all of the delay element inputs, and the outputs of all delay elements are summed (again, with selective polarity inversions). Furthermore, Jot's embodiments claim a means of attenuation vs. frequency for each delayed signal that is "proportional to each delay and inversely proportional to reverberation time." Jot's method and system also explicitly processes "a digital audio signal" and is silent about the use of an analog processing means or partial analog implementations thereof.

Frenette (J. Frenette, "*Reducing Artificial Reverberation Requirements Using Time-Variant Feedback Delay Networks*," http://mue.music.miami.edu/thesis/jasmin_frenette/, Masters Thesis, University of Miami, December 2000.) implements a digital software-based reverberator using Jot's embodiment of FIG. 2 using time-varying delay lengths. Frenette suggested that at least eight delay lines were needed for satisfactory echo density. This particular implementation computes the feedback matrix G using a circular permutation matrix $J_N$. The input signal is summed into the inputs of all delay elements and derives a stereo output by using an N-by-2 matrix for c with the following repeating sequence:

$$c = \begin{bmatrix} 1 & 1 \\ -1 & 1 \\ 1 & -1 \\ -1 & -1 \\ \vdots & \vdots \end{bmatrix}$$

Frenette examines different modulation waveform shapes, amplitudes and frequencies; and generally concludes that sinusoidal modulation with a frequency of 2 Hz and amplitude of 6 samples produces good results with minimal audible pitch change. Furthermore, a phase difference between the modulation waveform of each delay line reduces the audibility of pitch change in the reverberation tail. During listening tests, Frenette's 8-delay reverberator with 4 modulated delay lines was found to sound better than a 12-delay reverberator with no modulation.

As with Jot's embodiments, Frenette focuses exclusively on processing digital audio. Furthermore, the elements of the injection vector $b_i$ and mix vector $c_i$ all have a magnitude of 1. While this may maximize initial echo density, no study was given to how different values may affect subjective sound quality. While Frenette places some emphasis on processing efficiency, the goal is a high-quality reverberator suitable for use with a wide range of audio signals. The resulting implementation of Frenette requires a fairly substantial amount of digital processing resources. No study is given to how few delay lines are required for "adequate" sound quality.

There has been much progress in developing efficient reverberation algorithms; however, these algorithms are designed for implementation with digital electronics that is often too costly for the most cost-sensitive applications. Accordingly, there is a need for an apparatus that has the superior sound quality and small size of a digital reverberator with the low cost of a spring reverberator. For the preferred embodiment, the present art implements a high quality reverberator via integrated delay circuits in conjunction with the appropriate summing amplifiers, weighted feedback, and filters.

Accordingly, it is an object of the present invention to provide an apparatus and method for artificial reverberation which economically implements multi-dimensional or multi-delay reverberation within a small and easily assembled form.

Another object of the present invention is to provide an apparatus and method for artificial reverberation which may be quickly and easily utilized in any reverberation application with a minimum of engineering effort.

A further object of the present invention is to provide an apparatus and method for artificial reverberation which does not require the significant memory resources of digital signal processor reverberation designs yet allows for user delay and feedback weight adjustment.

SUMMARY OF THE INVENTION

In accordance with the present invention, the preferred embodiment represents an apparatus and method for artificial reverberation comprising a plurality of parallel delay elements interconnected using a FDN. FIG. 3 shows a preferred embodiment signal flow with FIG. 3*a* being a slight modification thereto. One or more input signals are summed to one or more signal nodes before the delay elements. One or more output signals are taken from the output of one or more delay elements. Output signals are taken from delay elements that do not have input signals applied to them. Using this method, the echo density of the reverberation is allowed to build slightly before the signal is output from the FDN, which further eliminates the need for an additional pre-delay element. Also, since the input signal must pass through at least two comb filters before reaching an output, this method improves upon the sometimes-unpleasant characteristic sound of a typical FDN reverberator. That is, the two comb filters diffuse the direct-path comb filtering present in the prior art. This improvement results in a more natural sounding FDN reverberator.

As seen in FIG. 3*a*, this aspect of the invention is generalized by the following equation:

$$|b_i|+|c_i|\approx 1$$

Where $b_i$ is the gain applied to an input into the $i^{th}$ delay element (or corresponding summation element) and $c_i$ is the gain applied to an output from the $i^{th}$ delay output, as defined by the Jot and Chaigne Equation. Using this expression, the input-to-output gain through any single delay path is $$|b_i|\times|c_i|$$

which minimizes the direct contribution of any one comb filter by constraining it to a maximum value of $0.5^2=0.25$, while also mitigating the increase in pre-delay that results from not injecting into and summing from all delay paths. Typically, the aforesaid equation is further qualified by stating that at least one value of $b_i\approx 1$ and one value of $b_i\approx 0$ (i.e. $c_i\approx 1$) such that the direct input-to-output gain through any single delay path is 0. That is, a second series combination output (i.e. filter and delay element) which feeds the output port has no direct input signal but instead must receive its input from a summation of one or more first series combination outputs (i.e. first filters and delay elements). The constraint of the equation further mitigates the effect noted by Jot of the "spurious echo" at a period equal to the sum of delays.

Furthermore, it should be understood that injecting the input signal into the reverberator may be accomplished by one signal into multiple delay paths, multiple signals into multiple delay paths, the weighted sum of multiple signals into one or more delay paths, or any combinations thereof. Likewise, output signals may be taken from the reverberator as a single signal from one delay output, multiple signals from multiple delay outputs, or one or more outputs as weighted sums of delay outputs. All of these cases are valid as long as they satisfy the constraint set forth in the aforesaid equation.

The present art invention exploits a psychoacoustic characteristic of human hearing called time masking. Since this algorithm uses relatively few delay elements, the initial echo density of the reverberation is sparse and builds over a few hundred milliseconds. However, reverberation that is used for vocals and most non-percussion instruments does not require as much echo density as reverberation used for percussive sounds. Most non-percussive sounds are long enough in duration to mask any initial insufficiency in echo density of a reverb. As such, this insufficiency is typically not noticed by the listener.

Another aspect of the present invention addresses the need for an inexpensive, high quality reverberator by combining digital and analog electronics. Artificial reverberation is created using a combination of delays, filters, and feedback. In this invention, the delay is implemented using digital electronics. Filtering and feedback, which consists of gain and summation, are preferably implemented using analog circuitry. The use of this combination of technologies results in a very cost-effective solution.

The preferred embodiment of the present art utilizes inexpensive, monolithic digital-delay integrated circuits for the delay lines and replaces the digital computational logic with analog circuitry. All filtering, summation, and gain is performed by inexpensive analog circuitry. Furthermore, by carefully selecting the delay times, modulating one or more of these delay times, and taking the output signal from delay lines exclusive of delay lines to which input is directly applied, the number of delay lines can be reduced while maintaining the desired audio quality.

BRIEF DESCRIPTION OF THE DRAWINGS

Numerous other objects, features, and advantages of the invention should now become apparent upon a reading of the following detailed description taken in conjunction with the accompanying drawings, in which.

DETAILED DESCRIPTION

Figure 1:
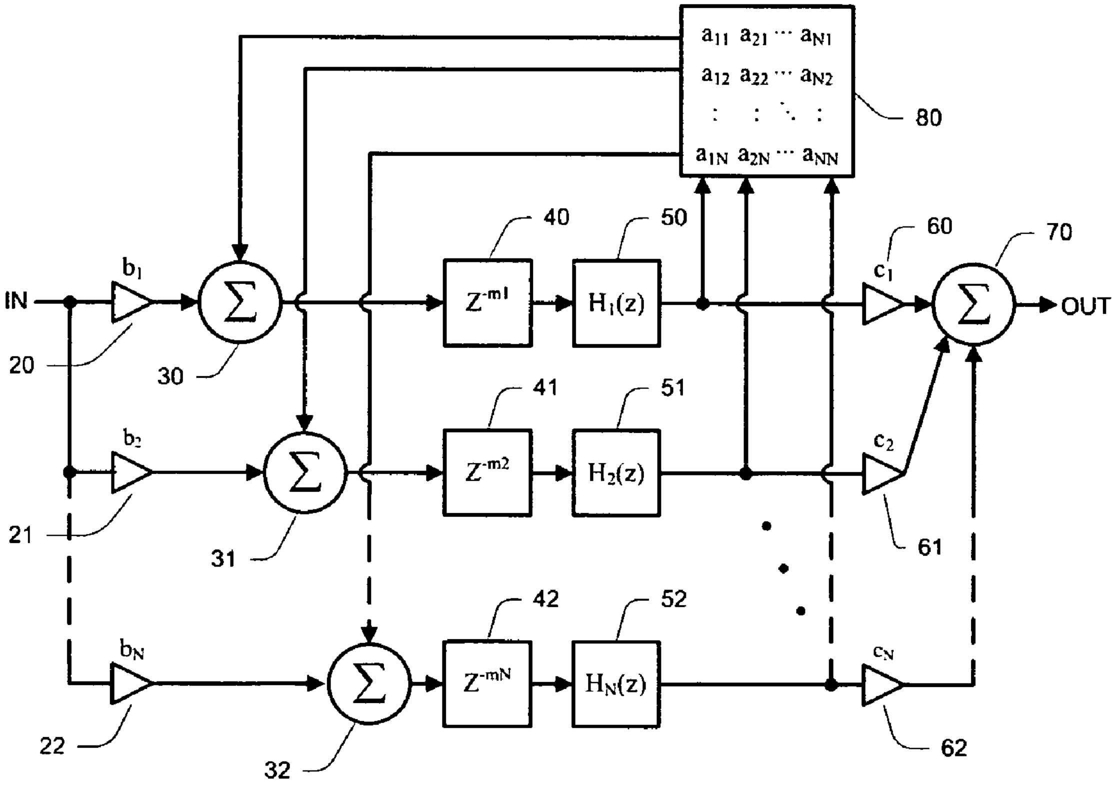
FIG. 1 (PRIOR ART)
FIG. 1 is a prior art signal flow diagram of Jot and Chainge's generalized FDN reverberator.
Figure 2:
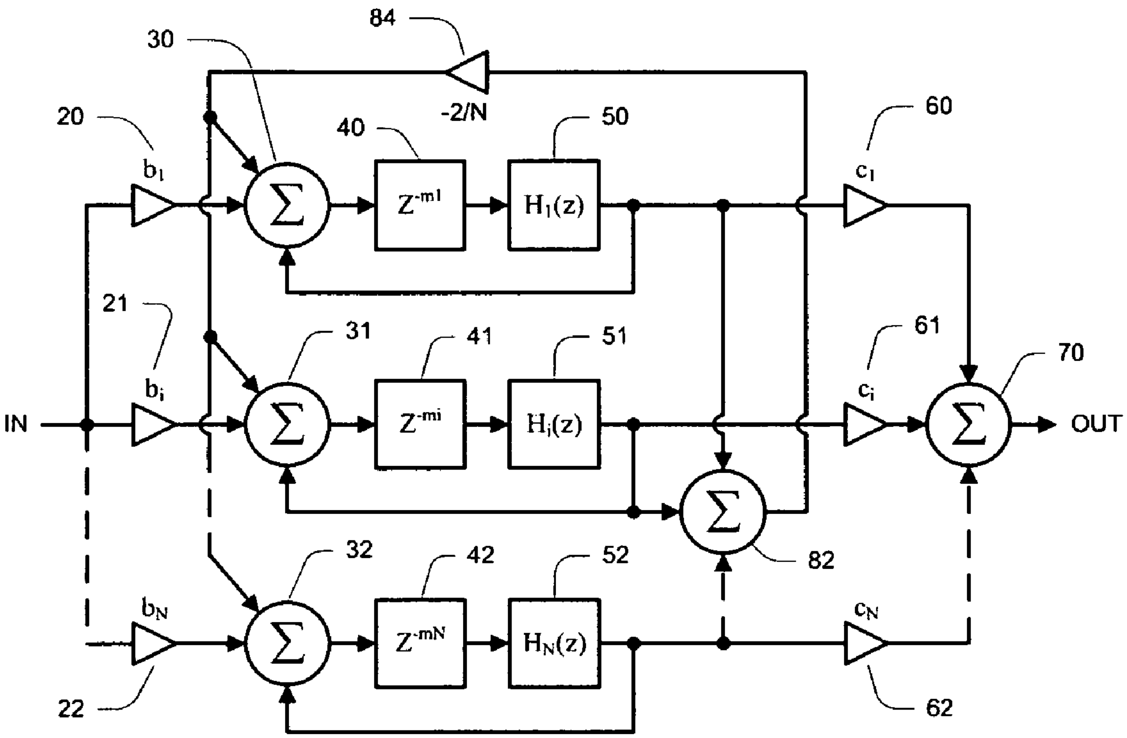
FIG. 2 (PRIOR ART)
FIG. 2 is a prior art signal flow diagram of a simplified embodiment of Jot et al.'s FDN reverberator.
Figure 3:
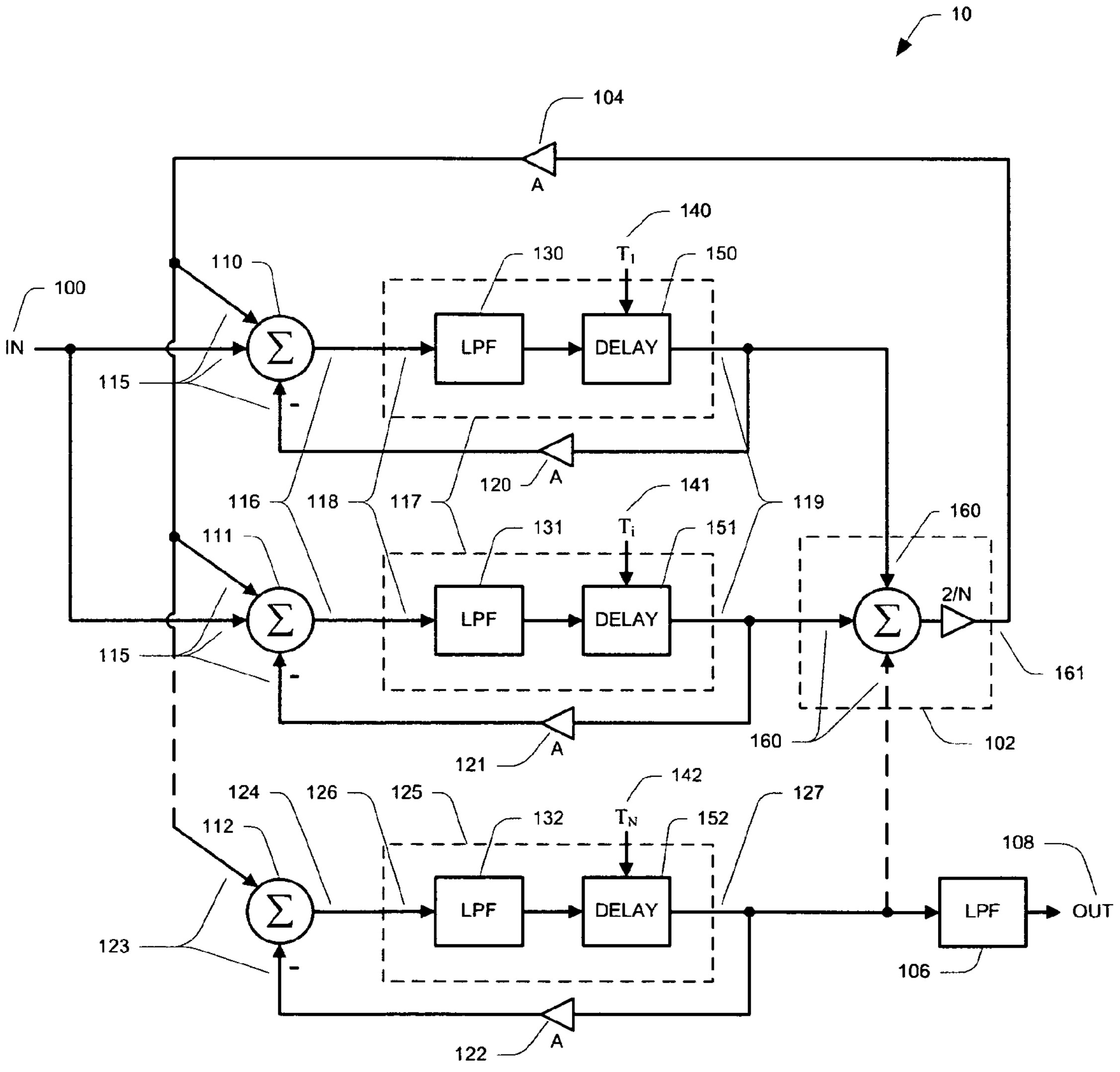
FIG. 3 is a signal flow diagram of a preferred embodiment of the present art apparatus and method for artificial reverberation, where the delay location of signal injection into the reverberator is mutually exclusive of a monaural signal output, and low-pass filters are added or relocated to be amenable to analog processing means.
Figure 3A:
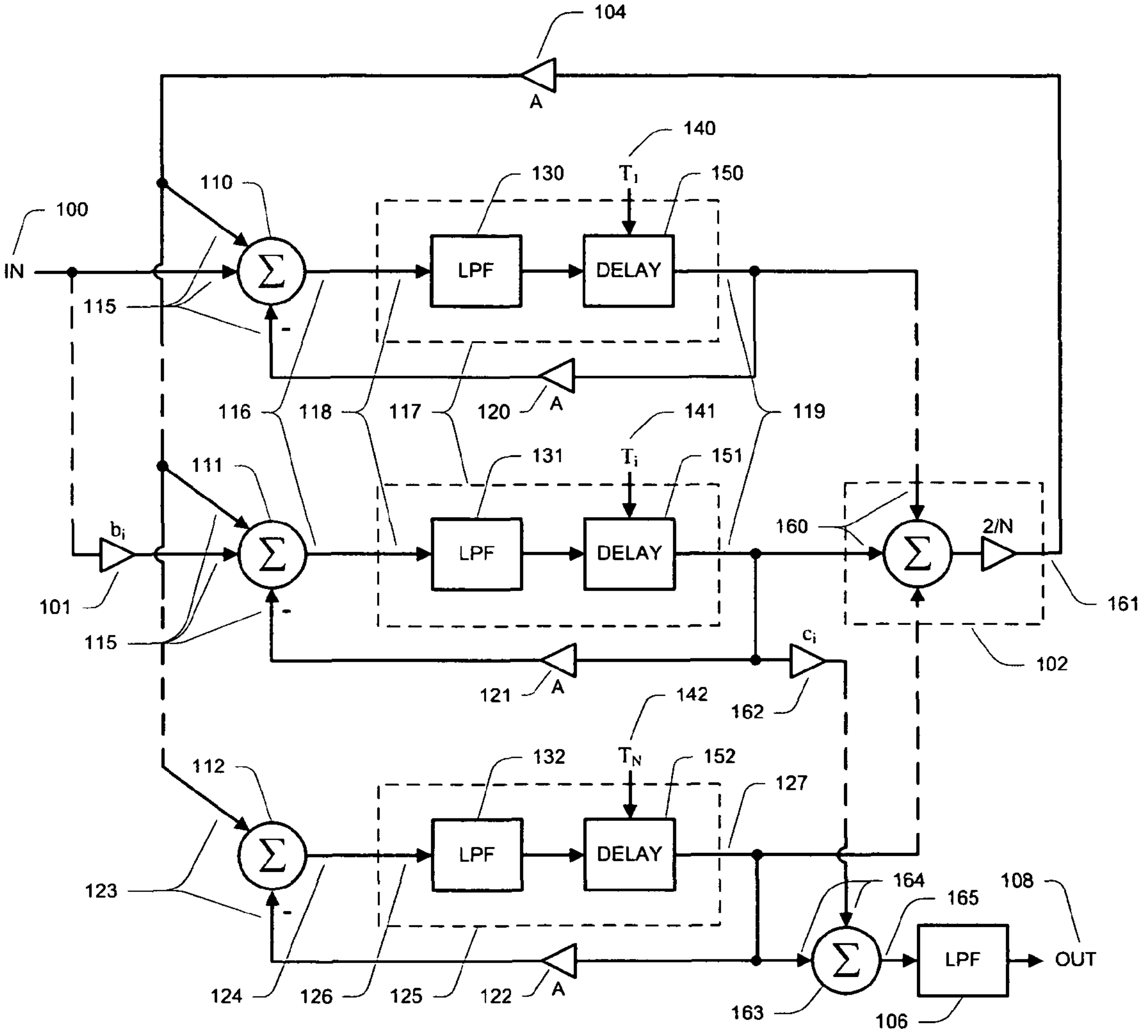
FIG. 3*a* is a signal flow diagram of an alternative embodiment as a modification of FIG. 3 which is configured to substantially satisfy the equation $|b_i|+|c_i|\approx 1$.
Figure 4:
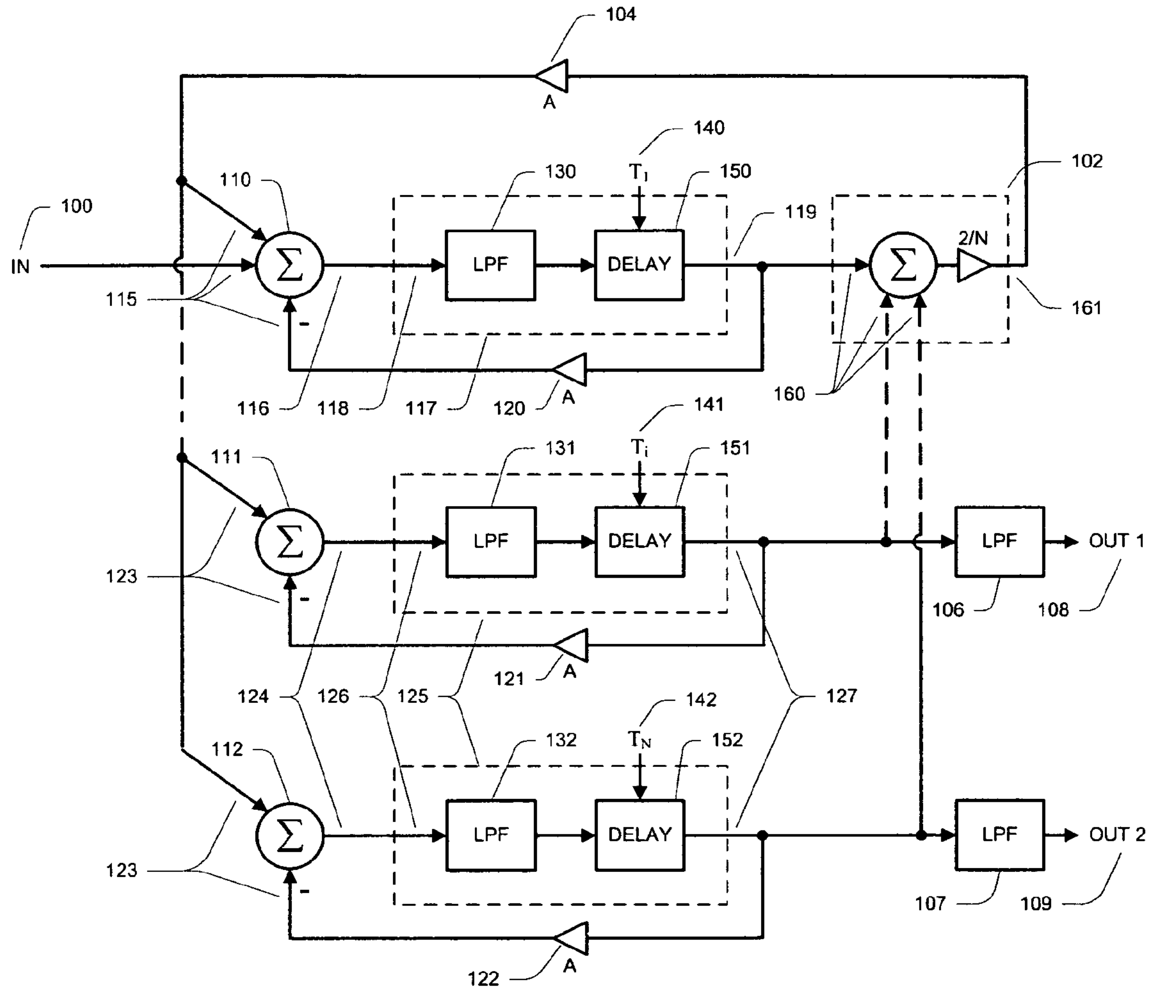
FIG. 4 is an alternative embodiment or variation of the signal flow diagram of FIG. 3 with two (stereo) signal outputs.
Figure 5:
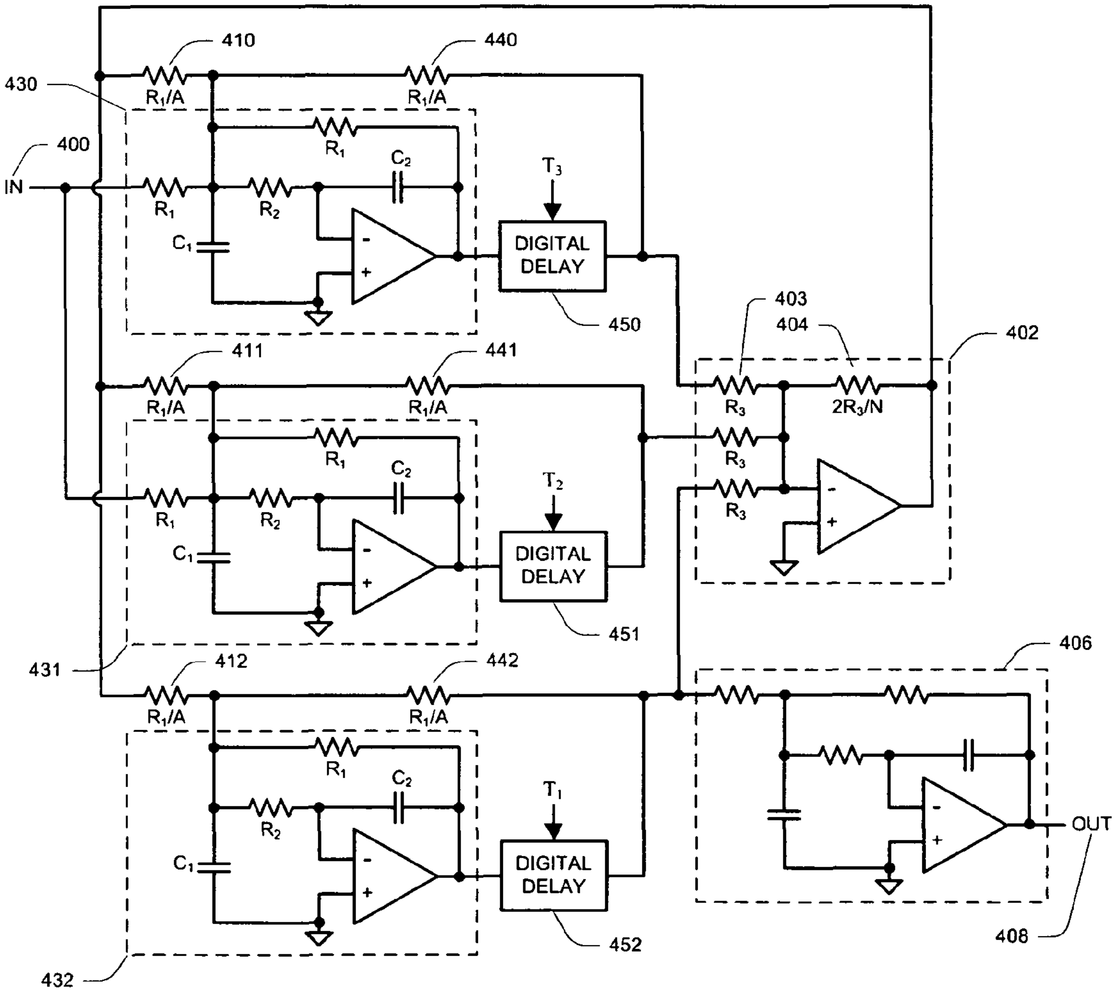
FIG. 5 is a circuit diagram illustrating the signal flow diagram of FIG. 3 where digital delay elements are combined with an analog feedback network.
Figure 6:
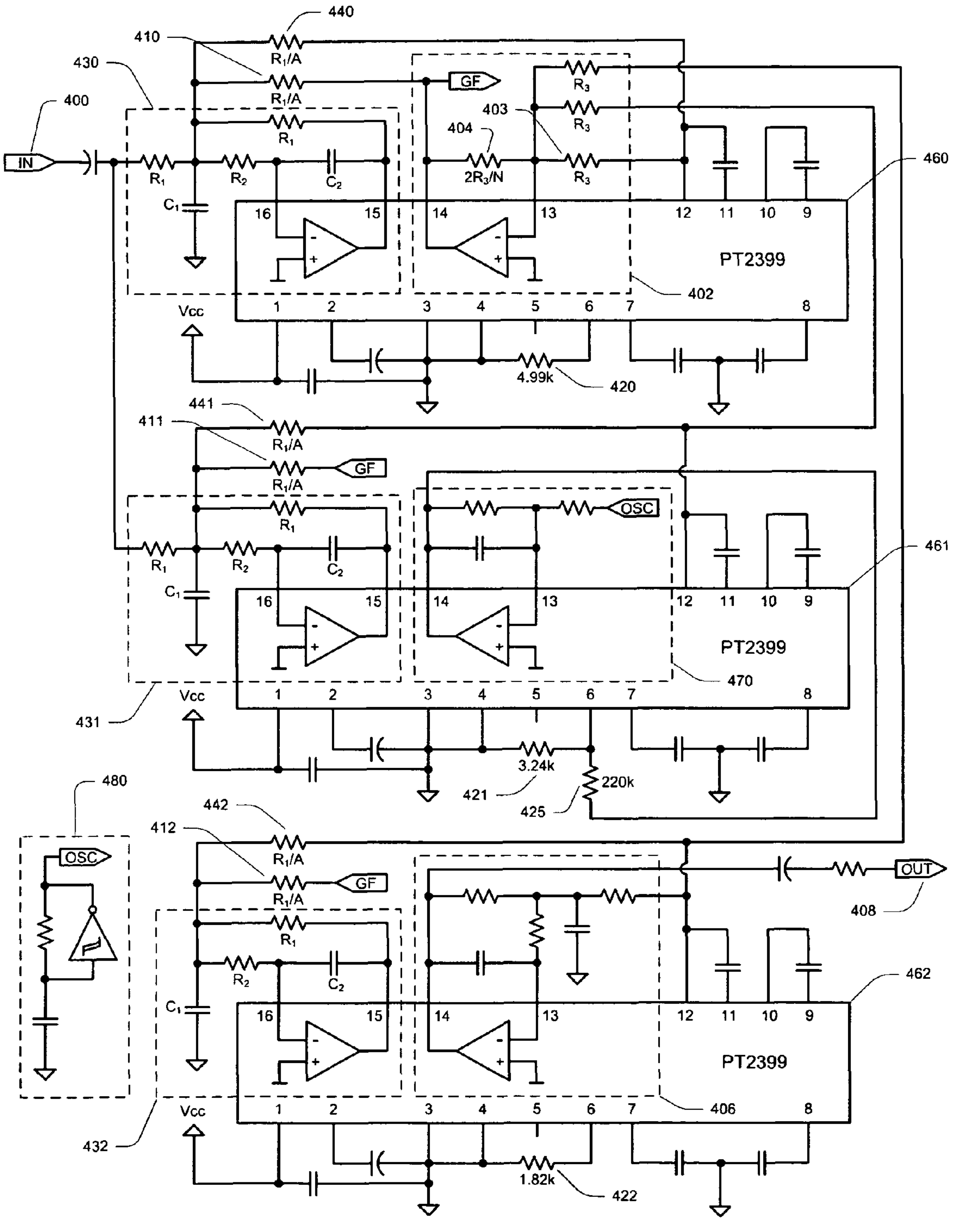
FIG. 6 is a more detailed circuit diagram of the FIG. 5 circuit which utilizes a Princeton Technologies Corp. PT2399 digital delay integrated circuits to implement the circuit of FIG. 5.

Referring now to the drawings, there is shown in FIGS. 3, 5, & 6 a preferred embodiment of the apparatus and method for artificial reverberation 10 and in FIGS. 3*a* & 4 a first alternative embodiment of the apparatus and method for artificial reverberation 10. The apparatus and method 10 allows electronic creation of artificial reverberation without the requirement for digital signal processors or the extensive engineering time and labor associated therewith. The present art minimizes cost by combining digital delay elements with an analog feedback network and maximizes sound quality while using a minimum of delay elements.

FIG. 3 illustrates a block signal flow diagram of the preferred embodiment of the present art. Although a total of three delay elements are shown, any number of delay elements greater than one is within the scope of this invention. An input signal is first applied or fed to input signal port 100 and then applied or fed to input summing nodes 110 and 111 at the input summing node inputs 115. It is recognized within the arts that a summing node has inputs which may be inverting or non-inverting and one or more outputs which represent the sum of the inverting and non-inverting inputs. For the present art, an inverting input has a "–" sign next to the summing node. For the preferred embodiment, the input summing node outputs 116 of input summing nodes 110, 111 are input to or fed to a first combination input 118 of a first series combination 117 of input filters 130, 131 (preferably low pass filters) and input delay elements 150, 151. Also for the preferred embodiment, the feedback summing node output 124, as a sum of the feedback summing node inputs 123 of the feedback summing node 112, is input or fed to a second combination input 126 of a second series combination 125 of a feedback filter 132 (preferably a low pass filter) and a feedback delay element 152 having a feedback delay time 142. The outputs 119, 127 of the first series combination 117 (i.e. filters 130, 131 and delay elements 150, 151) and the second series combination 125 (i.e. filter 132 and delay element 152), are fed to the inputs 160 of summing amplifier 102. In addition, the outputs 119, 127 of the first series combination 117 and the second series combination 125 (i.e. filters 130, 131, and 132 and delay elements 150, 151, and 152 respectively) are fed back through the respective attenuators 120, 121, and 122 respectively to inverting inputs of summing nodes 110, 111 and 112 respectively. The combination of amplifying and/or attenuating a summed output may also be referred to as weighting.

The output 161 of summing amplifier 102 has a preferred gain of 2/N or less and is fed back through global feedback attenuator 104 to all summing nodes 110, 111, and 112. As discussed, N is defined as the number of delay elements or series combinations 117, 125, and the letter N is henceforth used consistently to denote this quantity. In FIG. 3, three delay elements are shown, hence N=3. Alternative embodiments may utilize any number of delay elements greater than one without departing from the scope and spirit of the present art. The expandability of delay elements is illustrated in FIG. 3 with the dashed lines connecting the first two delay sections to the last delay section.

The gains "A" of attenuators 120, 121 and 122 are denoted by the letter A. The magnitude of the gain A must be between 0 and 1 for the reverberator FDN to be stable. Furthermore for the preferred embodiment, the gains A should be of substantially the same value for stability. Alternative embodiments may alter the gains A (i.e. A varies and is not constant) among each of the feedback paths. Gain value A controls the decay of reverberation, which is a measure of how long the reverberation is audible after the input signal is removed. Decay time, or $T_{60}$, is typically specified as the length of time for the reverberation level to drop by 60 dB after input signal has been removed.

For the preferred embodiment, the input summing node inputs 115 from the summing amplifier 102 fed through the global feedback attenuator 104 are negatively fed back into the input summing nodes 110, 111, et al. if the signals through the first minor loop feedback attenuators 120, 121, et al. and second minor loop feedback attenuators 122, et al. are positively fed back into the input summing nodes 110, 111, et al. Also for the preferred embodiment, the input summing node inputs 115 from the summing amplifier 102 fed through the global feedback attenuator 104 are positively fed back into the input summing nodes 110, 111, et al. if the signals through the first minor loop feedback attenuators 120, 121, et al. and second minor loop feedback attenuators 122, et al. are negatively fed back into the input summing nodes 110, 111, et al.

Filters 130, 131 and 132, preferably low-pass, have two purposes. When filters 130, 131 and 132 are implemented as analog low-pass filters, they act as anti-aliasing or band-limiting filters for delay elements 150, 151 and 152. Furthermore, low-pass filters 130, 131 and 132 emulate the absorption of high frequencies in air. As sound travels through air, high frequencies are absorbed more than low frequencies. In addition, as sound reflects off of surfaces within an enclosed space, different frequencies are absorbed by different amounts. Filters 130, 131 and 132 may be designed to mimic this natural absorption of high frequencies; or they may be designed to achieve subjectively pleasing, albeit unnatural results. Furthermore, filters 130, 131 and 132 may or may not be equivalent to each other in passband or cutoff characteristics. That is, the filters may have a plurality of different cutoff or 3 dB frequencies and band shapes which may be user adjustable in order to achieve a subjectively pleasing output or sound.

Delay elements 150, 151 and 152 have respective delay times 140, 141 and 142. In an embodiment of N=3 as shown in FIG. 3, delay times 140, 141 and 142 are specified as $7T_1/4$, $4T_1/3$ and $T_1$, where $T_1$ is approximately 50 ms; although any of a plurality of delay times are within the scope of this invention. For an embodiment such as shown in FIG. 6, the delay time is determined by a current sink from the voltage controlled oscillator (VCO) control line (pin 6 of the PT2399). The VCO drives the internal delay line at a lower or higher frequency based upon the current bias which respectively increases or decreases the overall delay. In an embodiment of the present art, delay time 141 is modulated by a low-frequency oscillator (LFO). In a preferred embodiment, The LFO modulates the delay time slightly at a frequency of approximately 1 Hz. This modulation helps to break up audible patterns in the reverberation tail and increases the perceived richness of the reverberator's sound. Alternative embodiments may utilize an LFO of a plurality of frequencies. That is, any number of modulated delays at any frequency, including the omission thereof, are within the scope of this invention.

For the preferred embodiment, the global feedback attenuator 104 has a gain value of 2A/N or less. Here, N is defined as the number of delay elements, and the letter N is henceforth used consistently to denote this quantity. In FIG. 3, N=3 since there are three delay elements; however, any number of delay elements greater than one is within the scope of the present art. Also in the preferred embodiment, the global feedback attenuator 104 gain may be incorporated into the summing amplifier 102 gain as a value representing the product of the aforesaid gains.

For the preferred embodiment, the output of delay element 152 or second series combination 125 is an input to low-pass filter 106. This output is taken from one or more delay elements whose input prior to low-pass filters 130, 131, and 132 and summing nodes 110, 111 and 112 are not summed with input signal 100. Low-pass filter 106 is an anti-aliasing or band-limiting filter for the output of delay element 152 which assures that the output is within the audio range for the preferred embodiment. The output of output low-pass filter 106 provides the output signal port 108 of the reverberator network. Alternative embodiments may forego use of the output low-pass filter 106 by simply feeding or connecting the second combination output 127 to the output signal port 108. More outputs may be added to the network by either removing an input from summing node 110 or 111 or by adding additional delay elements.

FIG. 3*a* shows an alternative embodiment of the present art, as a modification of FIG. 3, where input signal port 100 is weighted by input gain 101 before injection into input summing node(s) 111 et al. Output signal(s) 119 (i.e. first combination output 119) of series combination(s) 117 is weighted by output gain 162 before feeding into an output summing input 164 of output summing node 163. The output, i.e. output summing output 165, of summing node 163, in a preferred form of the alternative embodiment, is fed to low-pass filter 106. Further alternative embodiments may forego use of the low-pass filter 106 and feed the output of output summing node 163 directly to the output signal port 108. In the preferred form of the alternative embodiment, input gain 101 is specified as $b_i$, where $|b_i| \leqq 1$. Furthermore, output gain 162 or $c_i$ is approximately equal to $1-|b_i|$. In this embodiment, there may be one or more delay signal paths that include an equivalent to summing node 111 and series combination 117 and which feed output summing node 163 through an equivalent to output gain 162 or $c_i$ as indicated in FIG. 3*a* by the dashed lines. In this embodiment, the implied input gain of the first signal path (starting with summing node 110) is approximately unity, while the implied input gain of the last signal path (starting with summing node 112) is approximately zero. That is, for the feedback summing node 112 the input port 100 does not feed the feedback summing node inputs 123.

FIG. 4 shows an alternative embodiment of the present invention which provides stereo outputs. For a three element delay, i.e. N=3, input signal 100 is applied to only summing node 110. For N>3, input signal 100 may or may not be applied to additional input summing nodes. The output of delay element 151 is the input to low-pass filter 106, and the output of delay element 152 is the input to low-pass filter 107. The outputs of low-pass filters 106 and 107 feed the output signal ports 108 and 109 of the reverberator network. Except for these differences, the embodiment that describes FIG. 3 also describes the embodiment of FIG. 4. Each stereo output 108 and 109 may represent a different reverberation effect due to the different delays 141 and 142 and low pass filter characteristics 131 and 132 of the output delay networks.

FIG. 5 illustrates a circuit diagram of the present invention, where digital delays 450, 451, 452 are connected through an analog feedback network. Although three delay elements are shown, any number of delay elements greater than one is within the scope and spirit of the present art. Input signal 400 is input to low-pass filters 430 and 431. In the embodiment of FIG. 5, these low-pass filters also function as summing nodes or amplifiers; for example, low-pass filter 430 produces a weighted sum of the input signal 400 and signals through resistors 410 and 440. The input resistors of low-pass filters 430 and 431 have a value of $R_1$, which may be chosen somewhat arbitrarily depending on desired input impedance and noise criteria. $R_1$ is henceforth used to consistently describe this arbitrary value in ohms. Alternative embodiments can be envisioned where the summing nodes are separate from the low-pass filters, and these embodiments are within the scope of this invention.

In the preferred embodiment, low-pass filters 430, 431 and 432 are implemented using the multiple-feedback topology. This filter topology has less sensitivity to component tolerance and allows more flexibility in gain adjustment. In one embodiment, these low-pass filters are second-order and approximately Bessel-Thomson with a −3 dB or cutoff frequency of approximately 13.6 kHz. Second-order Bessel-Thomson is preferably chosen because it approximates the characteristic frequency-dependent absorption of sound in air. However, alternative topologies including but not limited to Sallen-Key filters, are also within the scope of this invention. Furthermore, different filter types, such as Butterworth, are also within the scope of this invention as are alternative orders and cutoff frequencies. The outputs of low-pass filters 430, 431 and 432 are inputs to digital delays 450, 451 and 452, respectively. Further alternative embodiments may utilize low-pass filters of plurality of forms.

Figure 7:
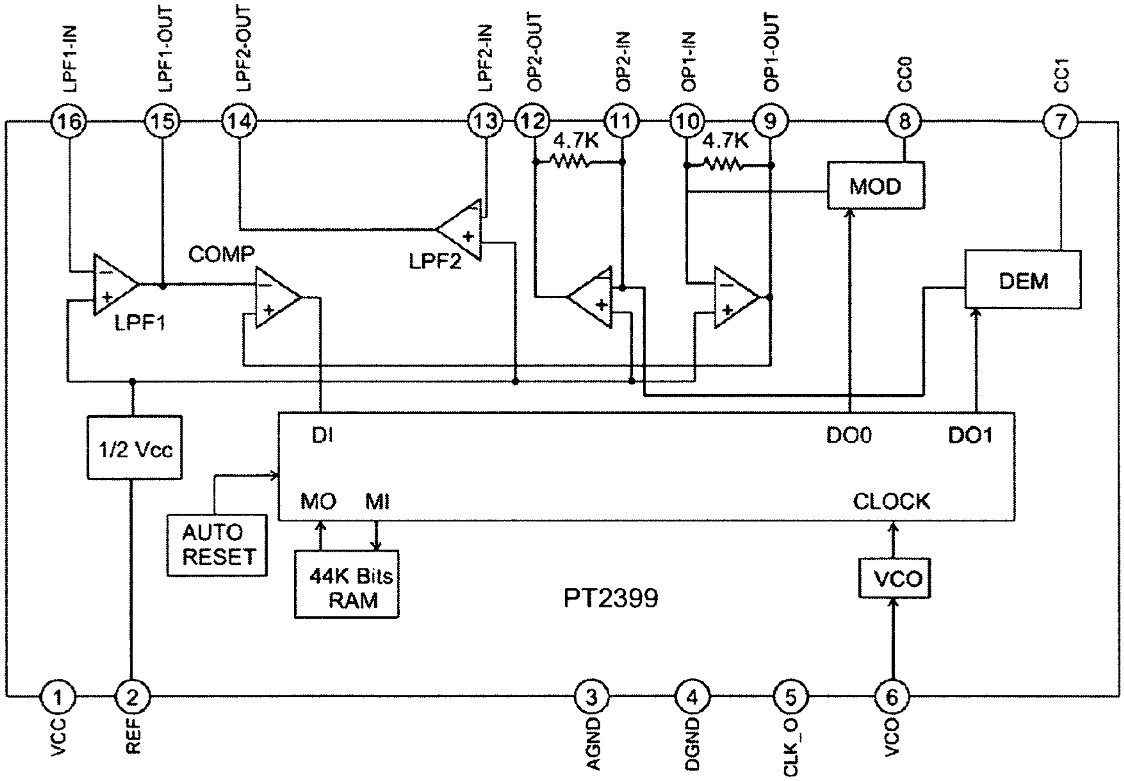
FIG. 7 is an internal schematic representation of the Princeton Technologies Corp. PT2399 as found within the datasheet therefore.

In the preferred embodiment of the invention, digital delays 450, 451 and 452 are monolithic integrated circuits (ICs) that include analog-to-digital conversion at the input and digital-to-analog conversion at the output. The digitized input signal is delayed by use of a digital memory, and the delay time is set by changing the sampling frequency. Alternative embodiments may include monolithic ICs that implement more than one digital delay. The internal operation of these ICs is recognized by those skilled in the arts and shown in FIG. 7.

Still referring to FIG. 5, one embodiment of the invention sets the delay time of digital delay 450, 451 and 452 to $7T_1/4$, $4T_1/3$ and $T_1$, where $T_1$ is approximately 50 ms. In a preferred embodiment the delay time of digital delay 451 is modulated by a small amount using a low-frequency oscillator (LFO) with alternative embodiments modulating one or more of the digital delays 450, 451, or 452 with an LFO. In one embodiment, the LFO is approximately a 1 Hz triangular waveform of approximately five volts peak. Alternative embodiments of frequency and wave shapes, including but not limited to sinusoidal or random waveforms, are within the scope of this invention. Furthermore, any number of modulated delays times, including the omission thereof, is within the scope of the present art. As aforesaid, any number of parallel delay elements greater than one is also within the scope and spirit of the present art.

In a preferred embodiment, the output of digital delay 450 is fed back to the summing node of low-pass filter 430 through resistor 440 with a value of $R_1/A$, although a plurality of other values may be utilized in alternative embodiments. Likewise, the output of digital delay 451 is fed back to the summing node of low-pass filter 431 through resistor 441, and the output of digital delay 452 is fed back to the summing node of low-pass filter 432 through resistor 442. The values of resistors 441 and 442 are preferably substantially equivalent to resistor 440. The outputs of digital delays 450, 451 and 452 are inputs to summing amplifier 402. In a preferred embodiment, summing amplifier 402 weights its inputs equally by $-2/N$ by setting the value of feedback resistor 404 to $2R_3/N$ and each input resistor 403 to $R_3$. The value of $R_3$ is somewhat arbitrary. The output of summing amplifier 402 is fed back to the inverting summing nodes of low-pass filters 430, 431 and 432 through resistors 410, 411 and 412, whose values are $R_1/A$ in a preferred embodiment, although a plurality of other values may be utilized in alternative embodiments.

Further referring to FIG. 5, the output of digital delay 452 is input to low-pass filter 406. In one embodiment, low-pass filter 406 acts as an anti-aliasing or band-limiting filter for digital delay 452. In a preferred embodiment, low-pass filter 406 is a second-order multiple feedback topology having an approximately Butterworth form with a −3 dB frequency of approximately 13.25 kHz. It is understood that a filter of any order, type, and topology is within the scope of the present art. The output of low-pass filter 406 becomes the output 408 of the circuit. In a preferred physical embodiment of the invention, the active analog components of low-pass filters 430, 431 and 432, summing amplifier 402, and low-pass filter 406 are a part of a monolithic integrated circuit that include digital delays 450, 451 and 452. It is understood that separating these active components are within the scope of the present art.

FIG. 6 shows a physical embodiment of the present invention which utilizes Princeton Technologies Corp. PT2399 digital delay ICs in order to implement the circuit of FIG. 5. The PT2399 is an inexpensive digital audio delay IC that contains integrated analog-to-digital and digital-to-analog conversion. The delay time is set by the value of an external resistor or an applied bias current to pin 6, which sets the IC's internal clock frequency. Each PT2399 contains two extra inverting operational amplifiers, allowing the entire circuit design to be efficiently implemented.

The embodiment of FIG. 6 preferably AC couples the input signal 400 to low-pass filters 430 and 431 via a plurality of means including the utilization of a series capacitor. Alternative embodiments may level shift the input whereby AC coupling is not utilized. The op-amps utilized for the filters 430, 431 are embedded within digital delay ICs 460 and 461, respectively. Each output pin 15 of low-pass filters 430, 431 and 432 are connected internally to the inputs of the delays in digital delay ICs 460, 461 and 462. The outputs of these delays are presented on pin 12 of each IC and are fed back through resistors 440, 441 and 442 to the inverting summing nodes of low-pass filters 430, 431 and 432, respectively.

The outputs (pin 12) of the delays in digital delay ICs 460, 461 and 462 are also inputs to summing amplifier 402, the op-amp of which is embedded within digital delay IC 460. The gain of summing amplifier 402 is −2/N and is output on pin 14 of digital delay IC 460, which is also denoted in the figure as node GF. The output of summing amplifier 402 is fed back into the inverting summing nodes of low-pass filters 430, 431 and 432, re-inverting the gain of summing amplifier 402 to 2/N. The output of digital delay IC 462 is the input to low-pass filter 406. The op-amp used for this filter is embedded within digital delay IC 462. The output of low-pass filter 406 is preferably AC-coupled to output 408 through an R-C filter.

The delay times for digital delay ICs 460, 461 and 462 are initially set using resistors 420, 421 and 422. In a preferred embodiment, respectively, these resistor values are 4.99 kΩ, 3.24 kΩ, and 1.82 kΩ, which correspond to delay times of 87.5 ms, 67 ms and 50 ms. Low-frequency oscillator 480 uses a Schmitt-trigger inverter connected between the input and output of an R-C circuit to generate a low-frequency square wave. The output of low-frequency oscillator 480 is the input to integrator 470, which is preferably implemented using the embedded op-amp in digital delay IC 461. Integrator 470 converts the square wave into a triangular LFO. Through the 220 kΩ resistor 425, the output of integrator 470 produces a small push-pull current on pin 6 of digital delay IC 461, which modulates its delay time by a small amount. That is, the current bias on the internal voltage controlled oscillator is altered by the LFO in order to change the internal delay clock frequency which thereby changes the delay time of the embedded digital delays.

FIG. 6 further shows other non-enumerated passive components which are necessary for the circuit's operation and are found within the Princeton Technology Corporation's datasheet for the PT2399 which is hereby incorporated by reference. The values of the afore described components are understood and readily chosen by one skilled within the relevant arts when analyzed in conjunction with the PT2399 datasheet. As the external interface circuitry may dictate a plurality of values for the aforesaid passive components, the application of the present art as viewed in conjunction with the datasheet by one skilled within the relevant arts will dictate the exact values required.

Further alternative embodiments of the present art may include one or more monolithic ICs that implement more than one digital delay. One alternative embodiment utilizes an ASIC (application-specific integrated circuit) to implement the digital delays and active analog electronics, including operational amplifiers and the Schmitt-trigger inverter used for the LFO. Any combination of digital, active analog, and passive analog electronics implemented within one or more monolithic ICs is within the scope of this invention. In FIGS. 3, 4, 5, and 6, it is understood that the actual signal output presented to the user is a weighted sum of the input signal(s) and output signal(s). The weighting of these signals is arbitrary based upon user preference and is often adjusted by the user by external means, including but not limited to digital and/or analog potentiometers.

The art of the present invention may be implemented via a plurality of means or apparatuses understood by those of ordinary skill within the electronic or computer arts. These include but are not limited to conventional integrated electronic circuits, a combination of analog and digital electronics, digital signal processors, microprocessors, micro-controllers, or computer algorithms.

Having described the invention in detail, those skilled in the art will appreciate that modifications may be made to the invention and its method of use without departing from the spirit herein identified. Therefore, it is not intended that the scope of the invention be limited to the specific embodiments illustrated and described. Rather, it is intended that the scope of this invention be determined by the appended claims and their equivalents.

What is claimed is:

1. An apparatus for artificial reverberation comprising:

an input signal port and an output signal port; and a value of N−1 input summing nodes where N represents an integer value of 2 or greater, each of said input summing nodes having one or more input summing node inputs and an input summing node output substantially representing the sum of said input summing node inputs; and said input signal port fed into one or more of said input summing node inputs; and a value of N−1 input filters and a value of N−1 input delay elements, each of said input delay elements representing a digital delay and having one or more input delay times; and said input filter and said input delay element arranged in a first series combination thereby forming N−1 first series combinations; and each of said first series combination having a first combination input and a first combination output, said first combination input fed by one of said summing node outputs; and each of said first series combination outputs fed into a summing amplifier having one or more inputs; and said summing amplifier having an output fed back into each of said input summing nodes; and N−1 first minor loop feedback attenuators; and said first series combination output negatively fed back through said first minor loop feedback attenuator into said input summing node which directly fed said first series combination if said summing amplifier output is positively fed back into said input summing nodes or said first series combination output positively fed back through said first minor loop feedback attenuator into said input summing node which directly fed said first series combination if said summing amplifier output is negatively fed back into said input summing nodes; and a feedback summing node, said feedback summing node having one or more feedback summing node inputs and a feedback summing node output substantially representing the sum of said feedback summing node inputs; and said summing amplifier output fed into one or more of said feedback summing node inputs; and said feedback summing node having no feed from said input signal port; and a feedback filter and a feedback delay element, said feedback delay element having one or more feedback delay times; and said feedback filter and said feedback delay element arranged in a second series combination thereby forming one or more second series combinations; and said second series combination having a second combination input and a second combination output, said second combination input fed by said feedback summing node output; and said second series combination output fed into one or more of said inputs of said summing amplifier; and said second series combination output negatively fed back through a second minor loop feedback attenuator into said feedback summing node input if said first series combination output is negatively fed back through said first minor loop feedback attenuator or positively fed back through said second minor loop feedback attenuator into said feedback summing node input if said first series combination output is positively fed back through said first minor loop feedback attenuator; and said second combination output fed to said output signal port representing an output signal whereby an artificial reverberation is reflected in said output signal relative to an input signal without a spurious echo.

2. The apparatus for artificial reverberation as set forth in claim 1, further comprising:

an output filter placed between said second combination output and said output signal port.

3. The apparatus for artificial reverberation as set forth in claim 1, further comprising:

one or more of said input filters and said feedback filters are low pass filters.

4. The apparatus for artificial reverberation as set forth in claim 2, further comprising:

one or more of said input filters, said feedback filters, or said output filters are low pass filters.

5. The apparatus for artificial reverberation as set forth in claim 1, further comprising:

an output summing node having one or more output summing inputs and at least one output summing output and placed between said second combination output and said output signal port whereby said output summing output feeds said output port; and one or more of said input summing node inputs fed by said input signal port are weighted by one or more input gains having a value of $b_i$, whereby the absolute value of $b_i$ is less than or equal to unity and i is an integer value representing an $i^{th}$ of said one or more input gains; and one or more of said first combination outputs fed through an output gain $c_i$, $c_i$ having a value of approximately $1-|b_i|$, and into one or more of said output summing inputs thereby constraining a magnitude of a product of $b_i$, and $c_i$ to 0.25 whereby stability is assured.

6. The apparatus for artificial reverberation as set forth in claim 5, further comprising:

an output filter placed between said output summing output and said output signal port.

7. The apparatus for artificial reverberation as set forth in claim 5, further comprising:

at least one value of $b_i$ is approximately equal to unity or one value of $b_i$ is approximately zero.

8. The apparatus for artificial reverberation as set forth in claim 5, further comprising:

one or more of said input filters and said feedback filters are low pass filters.

9. The apparatus for artificial reverberation as set forth in claim 6, further comprising:

one or more of said input filters, said feedback filters, or said output filters are low pass filters.

10. The apparatus for artificial reverberation as set forth in claim 1, further comprising:

said one or more first minor loop feedback attenuators having one or more gains having an absolute value of A which is greater than zero and less than or equal to unity; and a global feedback attenuator placed between said summing amplifier output and one or more of said input summing nodes, the combination of said global feedback attenuator and said summing amplifier having a gain of 2A/N or less.

11. The apparatus for artificial reverberation as set forth in claim 5, further comprising:

said one or more first minor loop feedback attenuators having one or more gains having an absolute value of A which is greater than zero and less than or equal to unity; and a global feedback attenuator placed between said summing amplifier output and one or more of said input summing nodes, the combination of said global feedback attenuator and said summing amplifier having a gain of 2A/N or less.

12. The apparatus for artificial reverberation as set forth in claim 1, whereby:

said input signal and output signal are electrical signals; and said summing nodes, filters, attenuators, and summing amplifiers are implemented via one or more analog networks; and said delay elements are implemented via one or more integrated circuits having an analog-to-digital conversion at an input and a digital-to-analog conversion at an output which are capable of providing said delay times.

13. The apparatus for artificial reverberation as set forth in claim 5, whereby:

said input signal and output signal are electrical signals; and said summing nodes, filters, attenuators, and summing amplifiers are implemented via one or more analog networks; and said delay elements are implemented via one or more integrated circuits which are capable of providing said delay times.

14. The apparatus for artificial reverberation as set forth in claim 1, further comprising:

a modulation of one or more of said delay times whereby a richness is imparted to said artificial reverberation.

15. The apparatus for artificial reverberation as set forth in claim 5, further comprising:

a modulation of one or more of said delay times whereby a richness is imparted to said artificial reverberation.

16. A method of simulating acoustic reverberation, the steps comprising:

applying an input signal to one or more input summing nodes having two or more input summing node inputs and an input summing node output; and summing said input summing node inputs and thereby forming said input summing node output; and delaying and filtering said output of each of said input summing nodes to produce a first combination output; and feeding back and attenuating, with an absolute value of unity or less, each of said first combination outputs to said input summing node input from which the input summing node output was delayed and filtered; and summing and weighting said first combination outputs and feeding back into one or more of said input summing node inputs and feeding into a feedback summing node input; and said feedback summing node having no feed of said input signal; and negatively feeding back each of said first combination outputs to said input summing node input if said summing and weighting said first combination outputs and feeding back into one or more of said input summing node inputs is positively fed back, or positively feeding back each of said first combination outputs to said input summing node input if said summing and weighting said first combination outputs and feeding back into said input summing node inputs is negatively fed back; and said feedback summing node having two or more of said feedback summing node inputs and a feedback summing node output; and delaying and filtering said feedback summing node output to produce a second combination output; and negatively feeding back said second combination output to said feedback summing node input from which the feedback summing node output was delayed and filtered if said first combination outputs to said input summing node are negatively fed back or positively feeding back said second combination output to said feedback summing node input from which the feedback summing node output was delayed and filtered if said first combination outputs to said input summing node are positively fed back; and said second combination output representing an artificial reverberation relative to said input signal without a spurious echo.

17. The method of simulating acoustic reverberation as set forth in claim 16, the steps further comprising:

weighting the input signal to one or more of said input summing node inputs, said weighting having a value of $b_i$ whereby the absolute value of $b_i$ is less than or equal to unity and i is an integer value representing an $i^{th}$ of said one or more summing nodes; and weighting one or more of said first combination outputs by a value of $c_i$, $c_i$ having a value of approximately $1-|b_i|$; and setting at least one of said values of $b_i$, to approximately one or one of said values of $b_i$ to approximately zero; and summing one or more of said weighted first combination outputs with said second combination output whereby said summing represents said artificial reverberation with a richness.

18. The method of simulating acoustic reverberation as set forth in claim 16, the steps further comprising:

modulating one or more of said delaying steps whereby a further richness is imparted to said artificial reverberation.

19. The method of simulating acoustic reverberation as set forth in claim 17, the steps further comprising:

modulating one or more of said delaying steps whereby a further richness is imparted to said artificial reverberation.

* * * * *